United States Patent [19]
Hata

[11] Patent Number: 5,268,596
[45] Date of Patent: Dec. 7, 1993

[54] METHOD AND APPARATUS FOR LATCHING DATA AROUND A LOGICAL DATA PROCESSOR

[75] Inventor: Masayuki Hata, Itami, Japan

[73] Assignee: Mitsubishi Denki Kabushiki Kaisha, Tokyo, Japan

[21] Appl. No.: 791,806

[22] Filed: Nov. 13, 1991

[30] Foreign Application Priority Data

Nov. 27, 1990 [JP] Japan .................................. 2-326869

[51] Int. Cl.$^5$ ......................................... H03K 19/017
[52] U.S. Cl. .................................... 307/443; 307/452; 307/481
[58] Field of Search ............... 307/443, 452, 453, 481, 307/353, 272.2; 377/74, 81

[56] References Cited

U.S. PATENT DOCUMENTS

| | | | |
|---|---|---|---|
| 3,862,440 | 1/1975 | Suzuki et al. | 307/452 X |
| 4,495,628 | 1/1985 | Zasio | 377/81 X |
| 4,794,276 | 12/1988 | Sasada et al. | 307/272.2 X |
| 4,820,943 | 4/1989 | Makino et al. | 307/452 X |
| 4,962,325 | 10/1990 | Miller et al. | 307/353 |
| 5,041,742 | 8/1991 | Carbonaro | 307/452 |
| 5,107,137 | 4/1992 | Kinugasa et al. | 307/272.2 |

FOREIGN PATENT DOCUMENTS 0143031 11/1979 Japan .................................... 377/74

OTHER PUBLICATIONS

Principles of CMOS VLSI Design, Weste et al, Oct. 1985, pp. 215 and 223.

Primary Examiner—David R. Hudspeth
Attorney, Agent, or Firm—Townsend and Townsend Khourie and Crew

[57] ABSTRACT

A control method for a data processing circuit which controls the timing of two clocks which independently control data latch circuits connected respectively with an input side and an output side of a logic circuit. The two clocks are held at a level which allows both data latch circuits to sample an input signal for a predetermined period. A data latch circuit comprises a first gate controlling whether or not an input signal is conducted to the logic circuit, an input end of a buffer circuit for latching the data signal and an output end of a second gate which causes an output of the buffer circuit to pass to an output end of the first gate, and a data processing circuit capable of sampling data, logically processing it, latching the result of the processing, and outputting it in one clock cycle, by interposing a logic circuit between the aforementioned two data latch circuits.

5 Claims, 5 Drawing Sheets

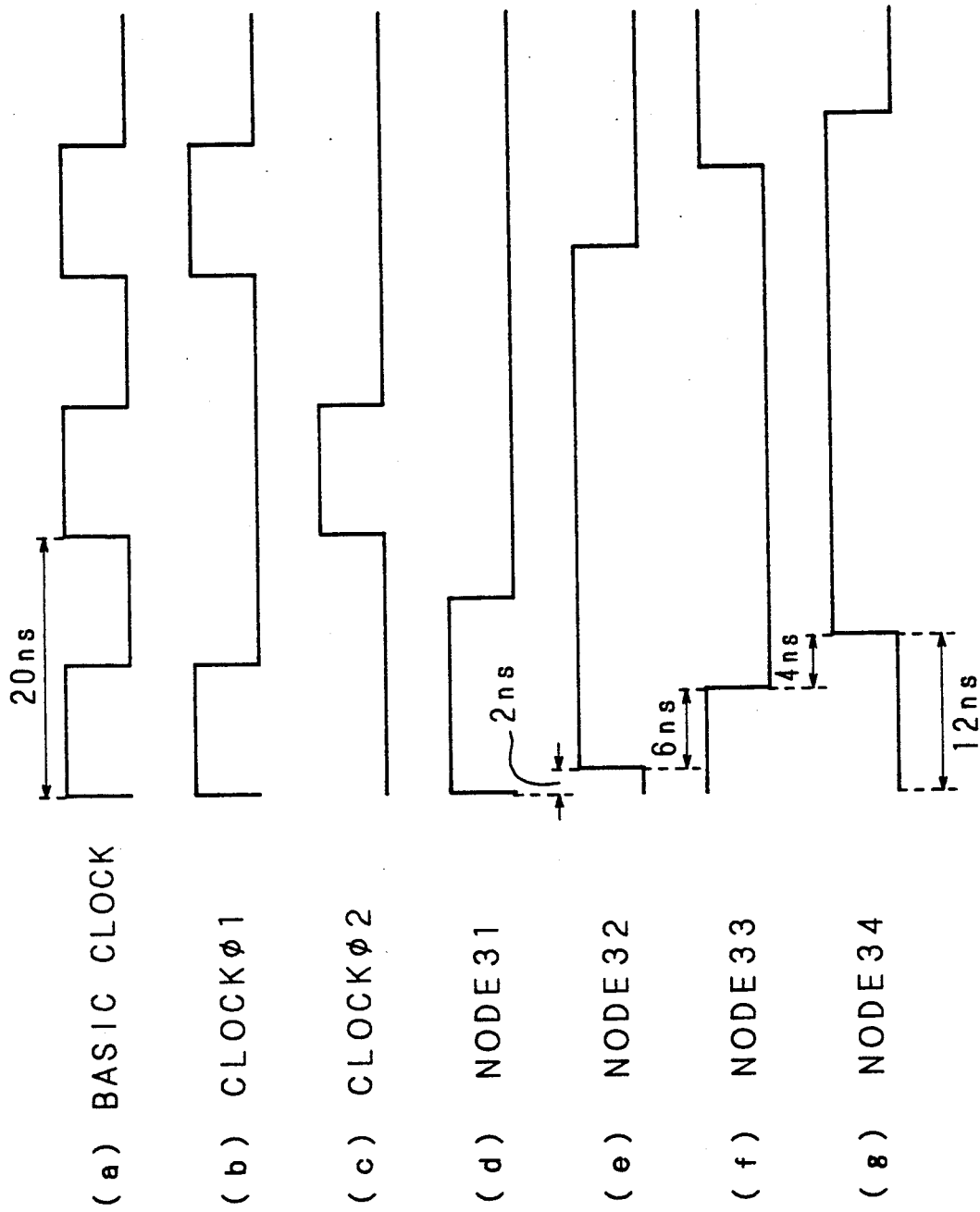

METHOD AND APPARATUS FOR LATCHING DATA AROUND A LOGICAL DATA PROCESSOR

BACKGROUND OF THE INVENTION

1. Field of the Invention

The present invention relates to a controlling method for data processing circuit, a data latch circuit used for data processing unit, and the data processing circuit, more particularly to a controlling method for operating a data processing circuit in which a logical circuit is interposed between two data latch circuits, and to a construction of a high-speed data latch circuit.

2. Description of Related Art

FIG. 1 is a circuit diagram showing an example of construction of a conventional general data processing circuit. In the conventional data processing circuit, a logical circuit is connected in series between two data latch circuits, each of the two data latch circuits clocked by different two-phase clocks.

In FIG. 1, a data signal to be processed is input at an input terminal 1. A first data latch circuit 2 samples and latches the data signal input from the input terminal 1 synchronous with clock $\phi 1$. A logical circuit 3 logically processes the data signal output from the first data latch circuit 2, and outputs a data signal, which is the result of the logical processing, to a second data latch circuit 4. The second data latch circuit 4 samples and latches the data signal output from the logical circuit 3 in synchronism with clock $\phi 2$ and outputs it to an output terminal 5.

The construction of the first data latch circuit 2 is as follows.

The input terminal 1 is connected to an input end of a transmission gate (N-channel transistor) 2a which is a first gate, and an output end of the transmission gate 2a is connected to an input end of an inverter 2b. An output end of the inverter 2b is connected to an input end of an inverter 2c, and an output end of the inverter 2c is connected to an input end of a transmission gate 2d and becomes an output line to the logical circuit 3 as well. An output end of the transmission gate 2d is connected between the output end of the transmission gate 2a and the input end of the inverter 2b.

In addition, clock $\phi 1$ is given to the gate terminal of both the transmission gates 2a and 2d. Both inverters 2b and 2c form a buffer circuit.

The logical circuit 3 consists of a plurality of NAND gates 3a, 3b and 3c, and the output end of the first data latch circuit 2 is connected to one input end of the NAND gate 3a, the output end of NAND gate 3a to one input end of NAND gate 3b, and the output end of NAND gate 3b to one input end of NAND gate 3c, the output end of the NAND gate 3c being an output line to the second data latch circuit 4. Logical circuit 3 inputs a data signal which is latched by the first data latch circuit 2 and outputs a data signal which has received a predetermined logical processing by the NAND gates 3a, 3b and 3c to the second data latch circuit 4.

The construction of the second data latch circuit 4 is as follows.

The output of logical circuit 3 is connected to an input end of a transmission gate (N-channel transistor) 4a and the output end of the transmission gate 4a is connected to an input end of an inverter 4b. The output end of the inverter 4b is connected to an input end of an inverter 4c, and the output end of the inverter 4c is connected to an input end of a transmission gate 4d and to an input end of an output buffer 4e. The output end of output buffer 4e becomes an output line of the second data latch circuit 4 which is connected to an output terminal 5. The output end of transmission gate 4d is connected between the output end of transmission gate 4a and the input end of inverter 4b.

In addition, clock $\phi 2$ is given to the gate terminals of both transmission gates 4a and 4d. In addition, inverters 4b and 4c form a buffer circuit.

The operation of such a conventional data processing circuit is as follows.

The first data latch circuit 2 samples a data signal given to the input terminal 1 when clock $\phi 1$ goes high and latches the data signal until clock $\phi 1$ goes high in a following clock cycle. Logical circuit 3 processes and outputs the data signal which is outputted from the first data latch circuit 2 until clock $\phi 2$ goes high following clock $\phi 1$ going high. The second data latch circuit 4 samples data output from logical circuit 3 when clock $\phi 2$ goes high and latches the signal until clock $\phi 2$ goes low, then high, and then outputs the signal to the output terminal 5.

That is, the data processing circuit shown in FIG. 1 samples an input data signal supplied to the input terminal 1, when clock $\phi 1$ is high, logical-processes it and outputs it to the output terminal 5 in synchronism with a rising edge of clock following clock $\phi 1$ being high.

Next, explanation will be given on the operation of a data latch circuit with the first data latch circuit 2 as an example.

When clock $\phi 1$ is high, transmission gate 2a is active, so the data signal given to the input terminal passes through transmission gate 2a to inverter 2b. As the inverter 2b inverts the data signal transmitted after passing through transmission gate 2a and outputs it, the negative logic of the data signal is transmitted to inverter 2c. Moreover, as inverter 2c inverts the data signal transmitted from inverter 2b and outputs it, the output of inverter 2c becomes positive logic of the data signal and becomes the output of the first data latch circuit 2.

In addition, when clock $\phi 1$ is high, transmission gate 2d becomes inactive, and the output of inverter 2c is not returned to the input end of inverter 2b. Accordingly, the output of the inverter 2c never collides with the output of transmission gate 2a.

When clock $\phi 1$ goes from high to low transmission gate 2a becomes inactive, and transmission gate 2d becomes active. Accordingly, regardless of the data signal input to input terminal 1, the output of inverter 2c is returned to the input end of inverter 2b through transmission gate 2d, so the output of inverter 2c, that is, the output of the first data latch circuit 2, is held while clock $\phi 1$ is low. In other words, when clock $\phi 1$ is high, the data signal input to input terminal 1 is latched by the first data latch circuit 2.

When clock $\phi 1$ goes high, the aforementioned state is canceled, and the first data latch circuit 2 changes to a state where the data signal input to input terminal 1 is output to logical circuit 3 again.

The second data latch circuit 4 operates in the same way.

Next, explanation will be made of the timing in the case where the circuit shown in FIG. 1 operates at a basic clock rate of 50 MHz with reference to the timing chart shown in FIG. 2. In addition, the time required for passing each state of the logical gate is assumed to be 2 ns.

As the basic clock shown in FIG. 2(a) is −50 MHz, one cycle thereof is 20 ns. Both clocks φ1 and φ2 shown in FIG. 2(b) and (c) are generated as non-overlap clocks, each obtained by frequency-dividing the basic clock, and each one cycle is 40 ns.

FIG. 2(d) shows a data waveform at a node 31 being between input terminal 1 and the first data latch circuit 2. FIG. 2(e) shows an output waveform of the first data latch circuit 2 at node 32 being between the first data latch circuit 2 and logical circuit 3. FIG. 2(f) shows an output waveform of logical circuit 3 at node 33 being between logical circuit 3 and second data latch circuit 4. FIG. 2(g) shows an output waveform of second data latch circuit 4 at node 34 being between second data latch circuit 4 and output terminal 5.

At the rising edge of clock φ1, the waveform of the data signal at node 31 shown in FIG. 2(d) given to input terminal 1 is output from first data latch circuit 2 after 6 ns, and becomes the waveform of node 32 shown in FIG. 2(e). The waveform of node 32 shown in FIG. 2(e) is output from logical circuit 3 after 6 ns and clock φ1 goes low, and becomes the waveform of node 33 shown in FIG. 2(f).

Here, to the other ends of NAND gates 3a, 3b and 3c of logical circuit 3, all high level signals are assumed to be input.

When clock φ2 goes high, the data signal output from logical circuit 3 is taken into second data latch circuit 4, and the waveform of node 34 shown in FIG. 2(g) is output after 8 ns from the rising edge of clock φ2.

As aforementioned, in the conventional data processing circuit, clock periods are allocated so that input terminal 1 may operate while clock φ1 is high, logical circuit 3 may operate while both clocks φ1 and φ2 are low, and second data latch circuit 4 may operate while clock φ2 is high. Accordingly, the data processing circuit processes one data input every two clock cycles of the basic clock.

In order to operate such a data processing circuit at high speeds, it is required to raise clock frequency. Recently, however, clock frequencies have risen as much as possible, and it is difficult to raise clock frequencies more than that of the present state. Moreover, a high frequency clock is accompanied with difficulty in system construction.

SUMMARY OF THE INVENTION

The present invention has been devised in consideration of such circumstances, and the primary object thereof is to provide a controlling method for operating a data processing circuit at high speeds without raising the clock frequency, a data processing circuit capable of operating at high speeds and a data latch circuit for realizing the above-mentioned data processing circuit.

In a control method for the data processing circuit, which is a first aspect of the present invention, both clocks which independently control data latch circuits respectively connected to the input side and the output side of a logical circuit, are controlled so as to keep both data latches sampling their inputs for a predetermined period. Since the data latch circuits connected to the input and output sides of the logical circuit sample their input signal simultaneously for a predetermined period, a signal which has been sampled by the data latch circuit at the input side of the logical circuits is processed by the logical circuit and latched by the data latch circuit at the output side of the logical circuit, in a predetermined period.

In the data latch circuit of a specific embodiment of the present invention, an output end of a first gate controlling the transmission of an input signal to the logical circuit, is directly connected to the output end of the data latch circuit, and an input end of a buffer circuit for latching the data signal and an output end of a second gate conducting the output of the buffer circuit connected to the output end of the first gate. Therefore, since the output end of the first gate conducting the input signal into the logical circuit is in direct contact with the output end of the data latch circuit, the input data signal is directly output delayed only by the first gate after the data signal is sampled, and the data signal having been latched by the buffer circuit, is output from the second gate.

In addition, in a data processing circuit of another embodiment of the present invention, a logical circuit is interposed between the aforementioned two data latch circuits. Consequently, the processing associated with data sampling, logical processing, latching and outputting the result of the above are performed in one clock cycle.

The above and further objects and features of the invention will be more fully apparent from the following detailed description with accompanying drawings.

BRIEF DESCRIPTION OF THE DRAWINGS

FIGS. 5(a)-5(g) form a timing chart showing an operation of the circuit shown in FIG. 4.

DESCRIPTION OF THE PREFERRED EMBODIMENT

In the following, description will be made of the invention referring to drawings showing the embodiments thereof.

At first, explanation will be made of the control method for the data processing circuit.

Figure 1:
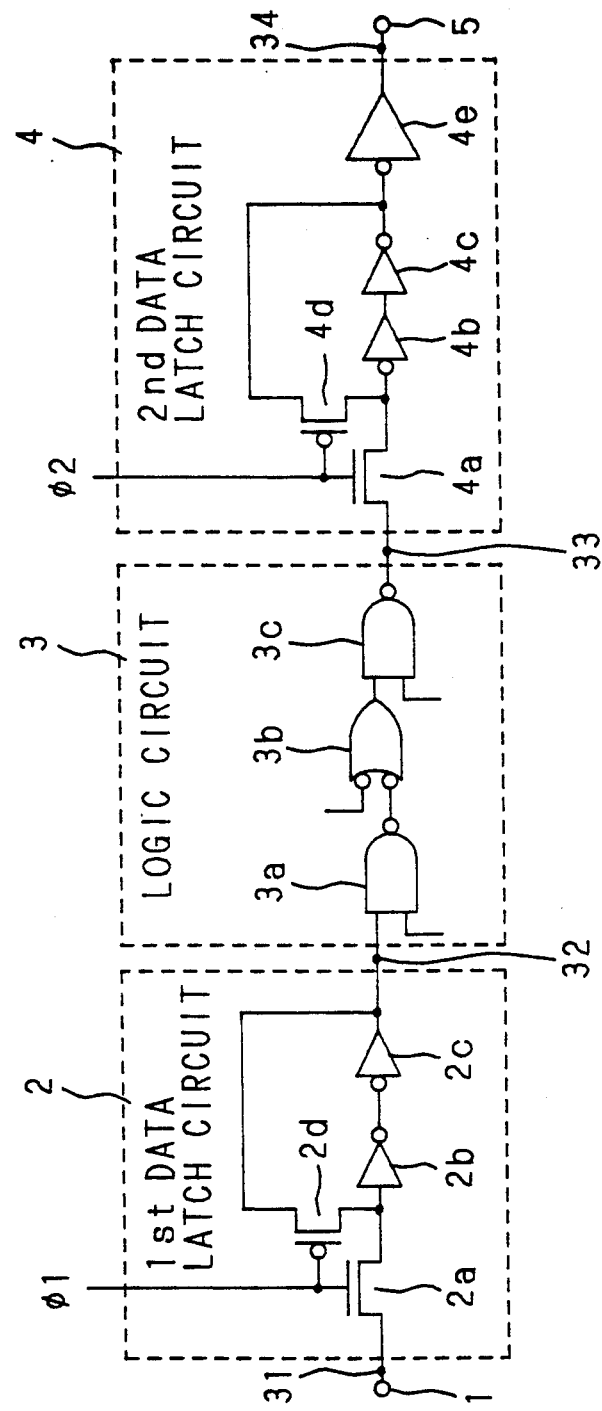
FIG. 1 is a circuit diagram showing a data processing circuit constructed using a conventional data latch circuits.

The control method for the data processing circuit is applied to the conventional data processing circuit shown in FIG. 1.

Figure 3:
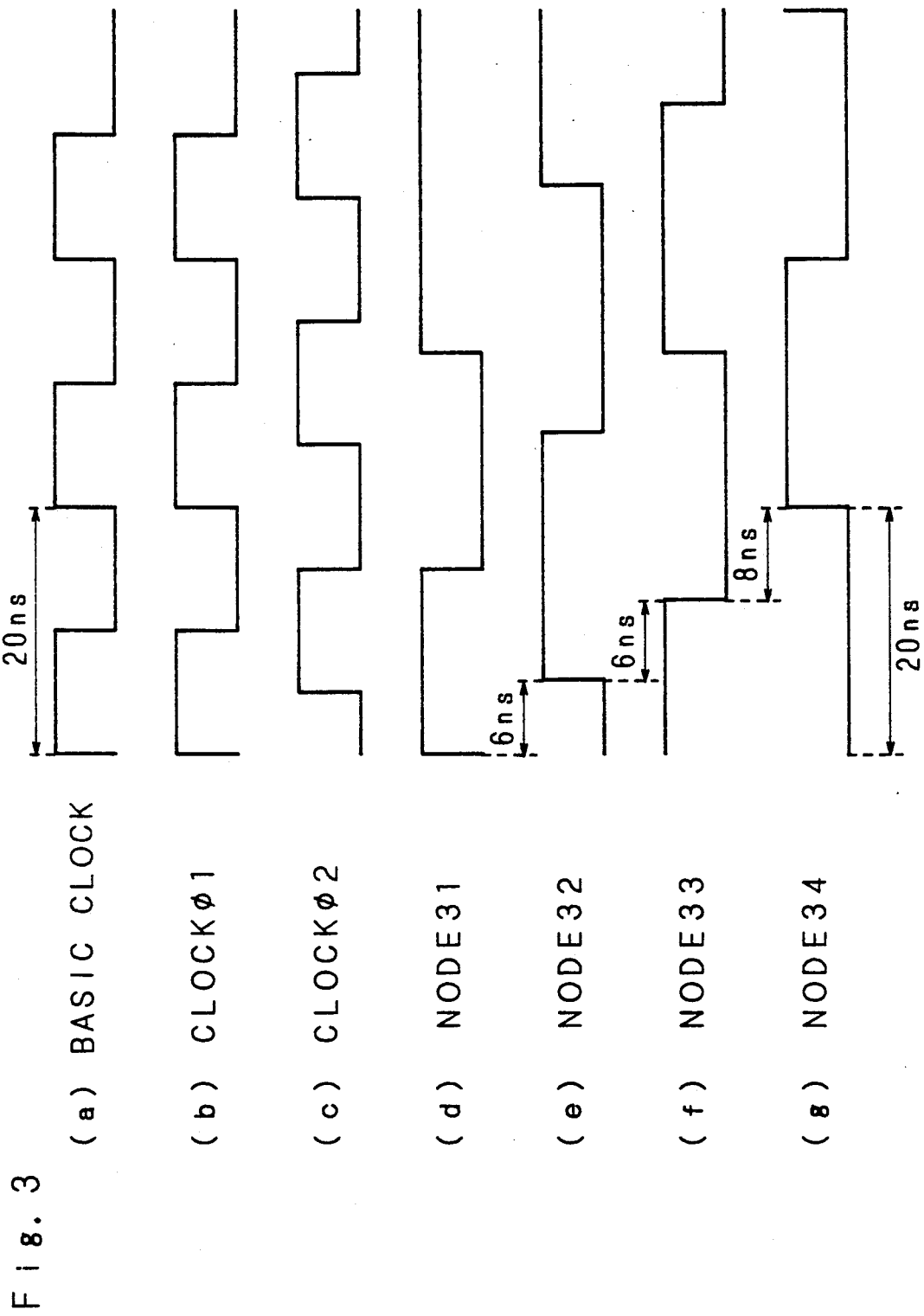
FIGS. 3(a)-3(g) form a timing chart showing an operation of a data processing circuit where the control method of the data processing circuit related to the invention is performed.

In the following, an explanation will be presented on the control method for the data processing circuit referring to the timing chart of FIG. 3 showing waveforms where the method is applied to the data processing circuit shown in FIG. 1.

In the present invention, the cycles of clock φ1 and φ2, as shown in FIG. 3(b) and (c) are basically the same as that of the basic clock shown in FIG. 3(a), and the phase difference between clock φ1 and the basic clock is 0. Clock φ2 differs from the basic clock and clock φ1 by 90°.

When clock φ1 goes high, the waveform of node 31 shown in FIG. 3(d), having been input to input terminal i, is output from first data latch circuit 2 after 6 ns and becomes the waveform of node 32 shown in FIG. 3(e).

The waveform output from first data latch circuit 2 is output from logical circuit 3 after another 6 ns while clock φ1 is low, and becomes the waveform of node 33 shown in FIG. 3(f).

At that point, clock φ2 is already high, and the second data latch circuit 4 samples the waveform at node 33 and outputs a waveform at node 34 after a delay of 8 ns, as shown in FIG. 3(g).

Here, inputs to the other ends of the NAND gates 3a, 3b and 3c are all assumed to be high.

In the conventional example, it requires 28 ns from the input of a data signal to input terminal 1 to the output of the data signal to output terminal 5, and requires two cycles of the basic clock to process one data. According to the control method for the data processing circuit according to the present invention, 20 ns is enough of a delay from the input of the data signal to input terminal 1 to the output of the data signal from output terminal 5, and thus one data is completely processed in one cycle of the basic clock.

Next, explanation will be made of the data latch circuit of the present invention and the data processing circuit using the data latch.

Figure 2:
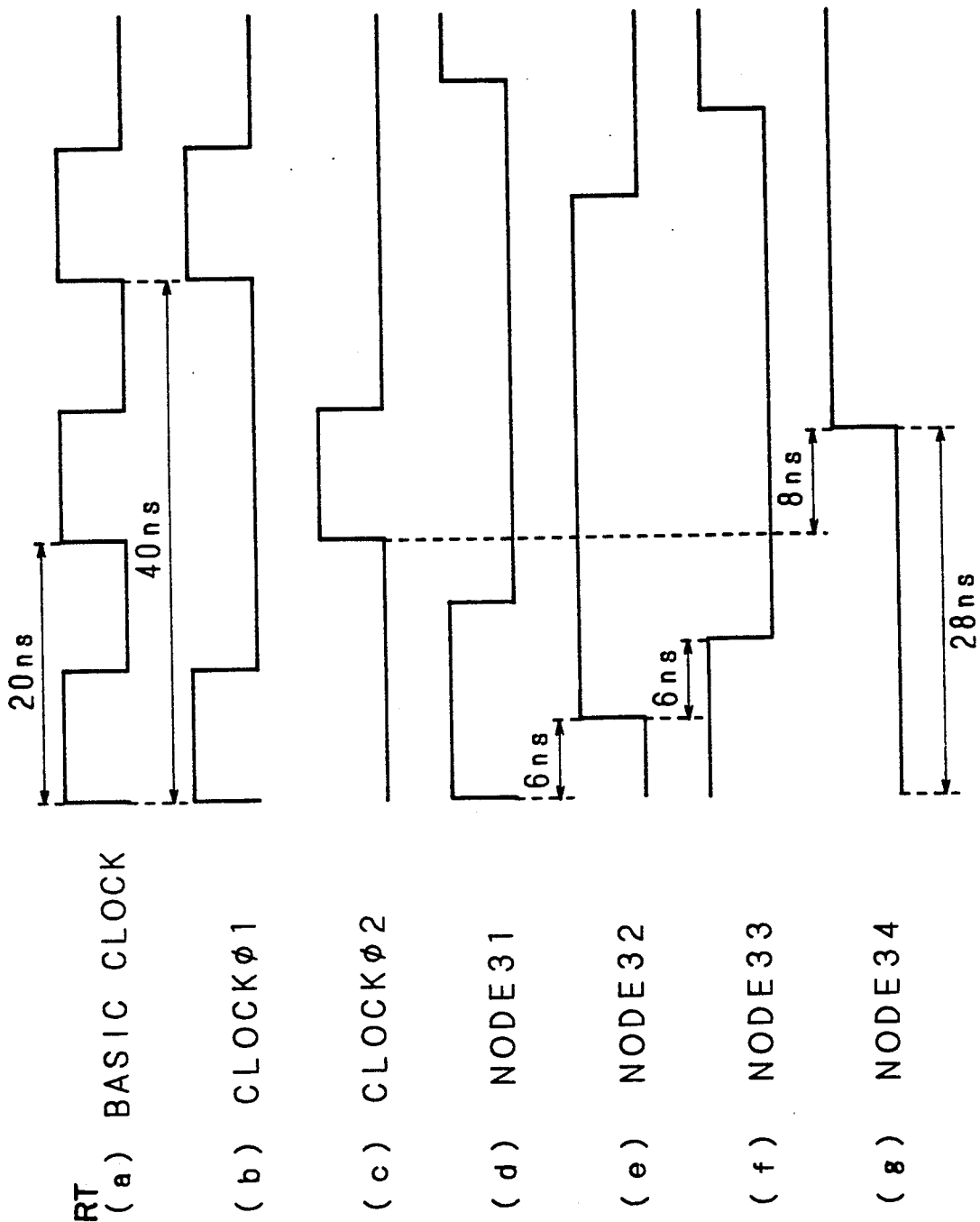
FIGS. 2(a)-2(g) form a timing chart showing an operation of the circuit in FIG. 1.
Figure 4:
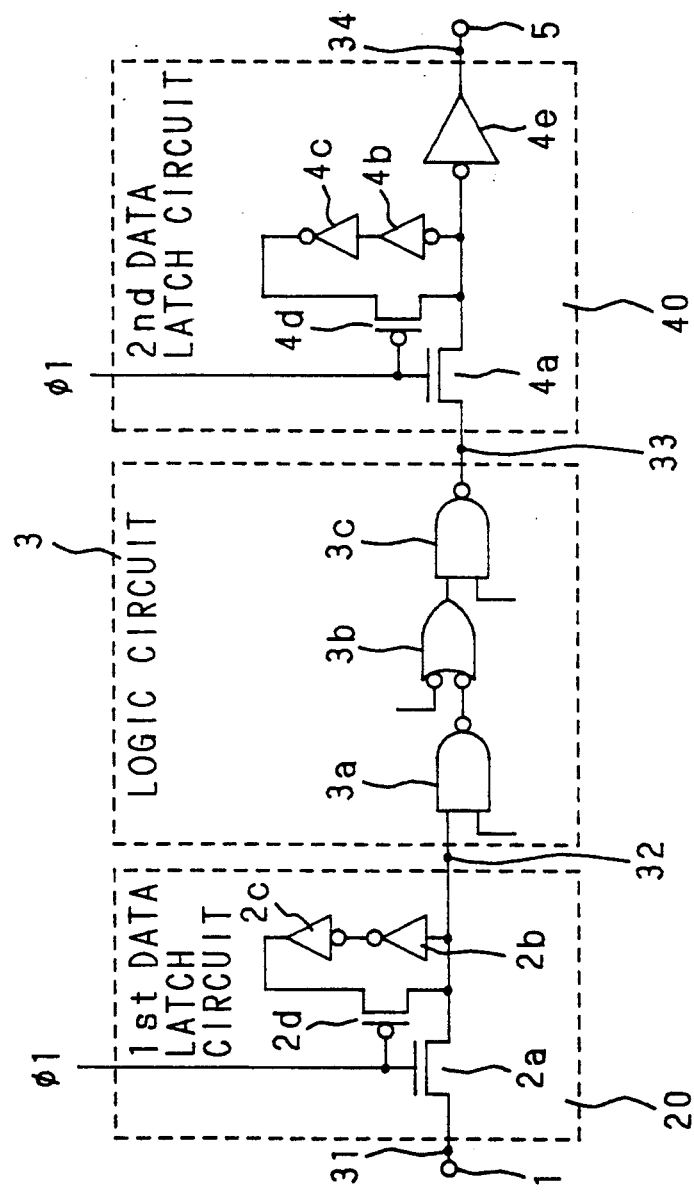
FIG. 4 shows a data latch circuit and a data processing circuit according to the present invention.

FIG. 4 is a circuit diagram showing the data processing circuit of the invention having been constructed by using a first data latch circuit 20 and a second data latch circuit 40 being the data latch circuits of the invention, and the same logical circuit 3 as that used in the conventional example shown in aforementioned FIG. 1. The data processing circuit operates synchronously with a single clock, such as either clock φ1 or clock φ2 shown in FIG. 2.

Similar symbols in FIG. 4 and in the conventional example in FIG. 1 refer to the similar or corresponding elements.

In FIG. 4, a data signal to be data-processed is input to input terminal 1. The first data latch circuit 20, being the data latch circuit of the invention, samples the data signal at the rising edge of clock φ1 and latches the signal. The logical circuit 3 logically processes the data signal latched by the first data latch circuit 20, and outputs a data signal resulting from the above processing to the second data latch circuit 40. The second data latch circuit 40 latches the data signal output from the logical circuit 3 at the falling edge of clock φ1 and outputs the signal to output terminal 5.

The construction of the first data latch circuit 20 is as follows.

Input terminal 1 is connected to the input end of transmission gate (N-channel transistor) 2a, which is the first gate, and the output end of transmission gate 2a is connected to an input line of logical circuit 3. The output end of the transmission gate 2a which is connected to logical circuit 3 is also connected to the input end of inverter 2b. The output end of inverter 2b is connected to the input end of inverter 2c, the output end of inverter 2c is connected to the input end of transmission gate 2d, the second gate, and the output end of transmission gate 2d is connected to the side of transmission gate 2a that is connected to logical circuit 3.

Clock φ1 is supplied to the gate terminals of the both transmission gates 2a and 2d. Both inverters 2b and 2c construct a buffer circuit.

Logical circuit 3 consists of a plurality of NAND gates 3a, 3b, 3c and the like, in the same way as the conventional example. The output end of the first data latch circuit 20 is connected with one input end of NAND gate 3a, the output of NAND gate 3a to one input of NAND gate 3b, and the output of the NAND gate 3b to one input of NAND gate 3c. The output of NAND gate 3c is an output line to the second data latch circuit 40. Logical circuit 3 inputs the data signal latched by the first data latch circuit 20 and outputs a data signal which is the result of receiving a predetermined logical processing through NAND gates 3a, 3b and 3c to the second data latch circuit 40.

The construction of the second data latch circuit 40 is as follows.

The output of logical circuit 3 is connected to an input of first transmission gate (N-channel transistor) 4a, and the output of transmission gate 4a is connected to the input of output buffer 4e and is also connected to the input of inverter 4b. The output of inverter 4b is connected to the input of inverter 4c, and the output of inverter 4c is connected to the input of second transmission gate 4d. The output of transmission gate 4d is connected to the output of transmission gate 4a.

Clock φ1 is supplied to the gate terminals of both transmission gates 4a and 4d, and inverters 2b and 2c form a buffer circuit. Except for the output buffer 4e connected on the output side of the second data latch circuit 40, the construction of the first data latch circuit 20 and the second data latch circuit 40 are the same.

Next, explanation will be made of an operation of a data latch circuit according to the present invention with first data latch circuit 20 as an example.

While clock φ1 is high, transmission gate 2a is active, and the data signal at input terminal 1 is directly transmitted to logical circuit 3 through transmission gate 2a, and is also transmitted to inverter 2b. As inverter 2b inverts the data signal at its input and outputs it, a negative logic of the data signal is transmitted to inverter 2c. As inverter 2c inverts the data signal transmitted from inverter 2b and outputs it, the output of inverter 2c becomes positive logic of the data signal, and the positive logic is transmitted to transmission gate 2d. However, as clock φ1 is high, transmission gate 2d is not active. Accordingly, the output of transmission gate 2a is never returned to the output of transmission gate 2a through the transmission gate 2d, therefore, the output of transmission gate 2d never collides with that of transmission gate 2a.

When clock φ1 drops from high to low, transmission gate 2a becomes inactive and transmission gate 2d becomes active. Therefore, regardless of the data signal input at the input terminal 1, the output of the inverter 2c is returned to the output of transmission gate 2a through transmission gate 2d, so the output of transmission gate 2a, that is, the output of the first data latch circuit 20, is kept at the state before clock φ1 went low. In other words, while clock φ1 is high, the data signal input at input terminal 1 is latched by first data latch circuit 20.

At the next rising edge of clock φ1, the aforementioned state is canceled, and the first data latch circuit 20 outputs the data signal input to input terminal 1 to logical circuit 3 again.

The operation of the second data latch circuit 40 is also the same.

The operation of the data processing circuit comprising the first data latch circuit 20 and the second data latch circuit 40 according to the present invention, and the logical circuit 3 interposed therebetween, is as follows.

The first data latch circuit 20 outputs a data signal input to input terminal 1 through to logical circuit 3, only passing through transmission gate 2a while clock φ1 is high. It takes 2 ns for the to pass through first data latch circuit 20.

Logical circuit 3 processes the data signal output from first data latch circuit 20 using the three NAND gates 3a, 3b and 3c and outputs a processed signal. It takes 6 ns to process data through logical circuit 3.

At this time, as clock φ1 is still high, the second data latch circuit 40 outputs the data output from logical circuit 3 to output terminal 5 through transmission gate 4a and output buffer 4e. Accordingly, it takes 12 ns for the data signal to be output to output terminal 5 from the time when it is input to input terminal 1.

That is to say, the data processing circuit shown in FIG. 4 samples an input signal from input terminal 1 while clock φ1 is high, logically processes it, and outputs the signal until the next rising edge of clock φ2. Therefore, where a plurality of such data processing circuits as shown in FIG. 4 are connected in series, it is possible for the data processing circuit in a next following stage to sample the data signal at the next rising edge of clock φ2, and it is possible for the data processing circuit in a next following stage to sample the data signal at the next rising edge of clock φ1.

Next, explanation will be given on the timing of the circuit shown in FIG. 4 when it is clocked by the basic clock of 50 MHz, referring to timing chart shown in FIG. 5. Again, the time required for a data signal to pass through each logical gate is assumed to be 2 ns.

The basic clock shown in FIG. 5(a) is 50 MHz, so one cycle thereof is 20 ns wide. Clock φ1 and φ2 shown in FIG. 5(b) and (c) are generated as non-overlap clocks obtained by frequency-dividing the basic clock, and one cycle thereof is 40 ns wide.

FIG. 5(d) shows a waveform of data at node 31 between input terminal 1 and first data latch circuit 20. FIG. 5(e) is an output waveform of first data latch circuit 20 at node 32 between first data latch circuit 20 and logical circuit 3. FIG. 5(f) is an output waveform of logical circuit 3 at node 33 between logical circuit 3 and second data latch circuit 40. FIG. 5(g) is an output waveform of second data latch circuit 40 at node 34 between second data latch circuit 40 and output terminal 5.

The waveform of the data signal at node 31 shown in FIG. 5(d) is input into input terminal 1. When clock φ1 is high, the input passes through first data latch circuit 20 after a delay of 2 ns, through transmission gate 2a inside first data latch circuit 20, and becomes the waveform at node 32 shown in FIG. 5(e). The waveform at node 32 shown in FIG. 5(e) is output from logical circuit 3 after 6 ns and clock φ1 goes low, and becomes the waveform at node 33 shown in FIG. 5(f).

Here, all inputs to the other ends of NAND gates 3a, 3b and 3c of logical circuit 3 are assumed to be high.

At this time, as clock φ1 is still high, second data latch circuit 40 outputs the data signal output by logical circuit 3 to output terminal 5 as the waveform of node 34 shown in FIG. 5(g), through transmission gate 4a and output buffer 4e. It takes 4 ns for the signal to pass through this second data latch circuit 40. Accordingly, it takes 12 ns for a data signal to be output to output terminal 5 from the time when it is input to input terminal 1.

That is, the data processing circuit shown in FIG. 4 samples the input signal from input terminal 1 while clock φ1 is high, logically processes the signal, and outputs it to output terminal 5 until the next rising edge of clock φ2. Therefore, where a plurality of such data processing circuits as shown in FIG. 4 are connected in series, it is possible for the data processing circuit to sample a data signal when clock φ2 is high, and it is possible for the data processing circuit in a following stage to sample the data signal at the next rising edge of clock φ1.

As has been described above, according to the control method for a data processing circuit, it is possible to operate the conventional data latch circuit and data processing circuit twice as fast as in the past.

And according to another aspect of the data latch circuit of the present invention, the inputted data signal is latched and output with a delay of only the gate controlling the sampling of data.

Furthermore, according to yet another aspect of the data processing circuit of the present invention, it is possible for one data to be processed during one cycle of the basic clock.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method for controlling signal flow in a data processing circuit which comprises at least a first data latch, a logic circuit, and a second data latch, the method comprising the steps of:

sampling a data signal during a first portion of a first clock;

latching said sampled data signal with the first data latch, during a second portion of said first clock;

processing said data signal in the logic circuit, after a first delay of said data signal through the first data latch;

sampling an output of the logic circuit, after a second delay of said data signal through the logic circuit, during a first portion of a second clock, said first portion of said second clock overlapping said first portion of said first clock by a period at least as long as said second delay; and latching said output of the logic circuit with the second data latch, during a second portion of said second clock whereby said data signal propagates from an input of the first data latch to an output of the second data latch in one clock cycle of said first clock.

2. A data latch circuit, comprising:

a first transmission gate which passes a signal from an input terminal to an output terminal when a clock signal applied to a gate terminal of said first transmission gate is a first value, and which blocks said signal from passing from said input terminal to said output terminal when said clock signal is a second value;

a buffer circuit, coupled at a buffer input terminal to said input terminal, which buffers a signal from said buffer input terminal to a buffer output terminal; and a second transmission gate with a first transmission terminal coupled to said buffer output terminal of said buffer circuit, a second transmission terminal coupled to said output terminal, and a gate terminal coupled to said gate terminal of said first transmission gate, wherein said second transmission gate passes a signal from said buffer output terminal to said output terminal when a clock signal is said second value, and which blocks said signal from passing from said buffer output terminal to said output terminal when said clock signal is said first value;

whereby a signal input at said input terminal is available at said output terminal when said clock signal is said first value and, when said clock signal is said second value, a value of said input signal at a time when said clock signal last changed from said first value to said second value is held at said output terminal.

3. A data latch circuit, comprising:

an input terminal, for accepting a data signal;

a first transmission gate with a first signal terminal coupled to said input terminal, for controlling continuity of said data signal between said first signal terminal and a second signal terminal of said first transmission gate according to a control signal applied at a gate terminal of said first transmission gate;

a second transmission gate, for controlling continuity of said data signal between a first signal terminal and a second signal terminal of said second transmission gate according to said control signal applied at a gate terminal of said second transmission gate, where said control signal either turns said first transmission gate on and said second transmission gate off, or turns said first transmission gate off and said second transmission gate on;

a buffer circuit with an input terminal coupled to said second signal terminal of said first transmission gate and said second signal terminal of said second transmission gate, and an output terminal of said buffer circuit coupled to said first signal terminal of said second transmission gate; and a data output terminal coupled to said second signal terminal of said first transmission date, said second signal terminal of said second transmission gate, and said input terminal of said second transmission gate, and said input terminal of said buffer circuit whereby said data signal accepted at said input terminal is available at said data output terminal when said control signal turns said first transmission gate on, and when said control signal turns said second transmission gate on, a value of said data signal at a time when said control signal last turned off said first transmission gate is held at said output terminal.

4. A data processing circuit, comprising:

a first data latch and a second data latch, each comprising:

a first transmission gate passes a signal from an input terminal to an output terminal when a clock signal applied to a gate terminal of said first transmission gate is a first value, and which blocks said signal from passing from said input terminal to said output terminal when said clock signal is a second value;

a buffer circuit coupled at a buffer input terminal to said output terminal, which buffers a signal from said buffer input terminal to a buffer output terminal; and a second transmission gate with a first transmission terminal coupled to said buffer output terminal of said buffer circuit, a second transmission terminal coupled to said output terminal, and a gate terminal coupled to said gate terminal of said first transmission gate, wherein said second transmission gate passes a signal from said buffer output terminal to said output terminal when a clock signal is said second value, and which blocks said signal from passing from said buffer output terminal to said output terminal when said clock signal is said first value and a logic circuit with an input coupled to said output terminal of said first data latch and an output coupled to said input terminal of said second data latch.

5. A data processing circuit, comprising:

a first data latch and a second data latch, each comprising:

an input terminal, for accepting a data signal;

a first gate with a first signal terminal coupled to said input terminal, for controlling continuity of said data signal between said first signal terminal and a second signal terminal of said first gate according to a control signal applied at a gate terminal of said first gate;

a second gate, for controlling continuity of said data signal between a first signal terminal and a second signal terminal of said second gate according to said control signal applied at a gate terminal of said second gate, where said control signal either turns said first gate on and said second gate off, or turns said first gate off and said second gate on;

a buffer circuit with an input terminal coupled to said second signal terminal of said first gate and said second signal terminal of said second gate, and an output terminal of said buffer circuit coupled to said first signal terminal of said second gate; and a data output terminal coupled to said second signal terminal of said first gate, said second signal terminal of said second gate, and said input terminal of said buffer circuit; and a logic circuit with an input coupled to said data output terminal of said first data latch and an output coupled to said input terminal of said second data latch.

* * * * *